(12) United States Patent
Sheng

(10) Patent No.: US 8,255,863 B2
(45) Date of Patent: Aug. 28, 2012

(54) PRINTED CIRCUIT BOARD LAYOUT SYSTEM AND METHOD THEREOF

(75) Inventor: Xiao-Cheng Sheng, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 188 days.

(21) Appl. No.: 12/790,871

(22) Filed: May 31, 2010

(65) Prior Publication Data

US 2011/0119647 A1     May 19, 2011

(51) Int. Cl.
*G06F 17/50* (2006.01)

(52) U.S. Cl. .................... 716/137; 716/110; 716/139

(58) Field of Classification Search ............... 716/122
See application file for complete search history.

(56) References Cited

U.S. PATENT DOCUMENTS

2008/0189080 A1* 8/2008 Tenma et al. .................... 703/1
* cited by examiner

*Primary Examiner* — Paul Dinh
*Assistant Examiner* — Bryce Aisaka
(74) *Attorney, Agent, or Firm* — Altis Law Group, Inc.

(57) ABSTRACT

A printed circuit board layout system and a method thereof are provided. The method includes the following steps: obtaining the outline information, the boundary information, and the auxiliary line information, when a command for recording position information of points within each of the boundaries is input; obtaining position information of the points within each of the boundaries; setting corresponding height values as height limit of height restriction areas corresponding to the points within each of the boundaries.

11 Claims, 5 Drawing Sheets

PRINTED CIRCUIT BOARD LAYOUT SYSTEM AND METHOD THEREOF

BACKGROUND

1. Technical Field

The present disclosure relates to the printed circuit board (PCB) layout field and, particularly, to a PCB layout system and a method thereof.

2. Description of Related Art

When designing PCBs using a software, heights of electronical components should be considered. In order to have the software automatically warn designers when a component they select will not fit on an area of the PCB because of certain design parameters, a plurality of height and clearance limits should be input to the software, which is troublesome and time consuming.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the PCB layout system and method thereof. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
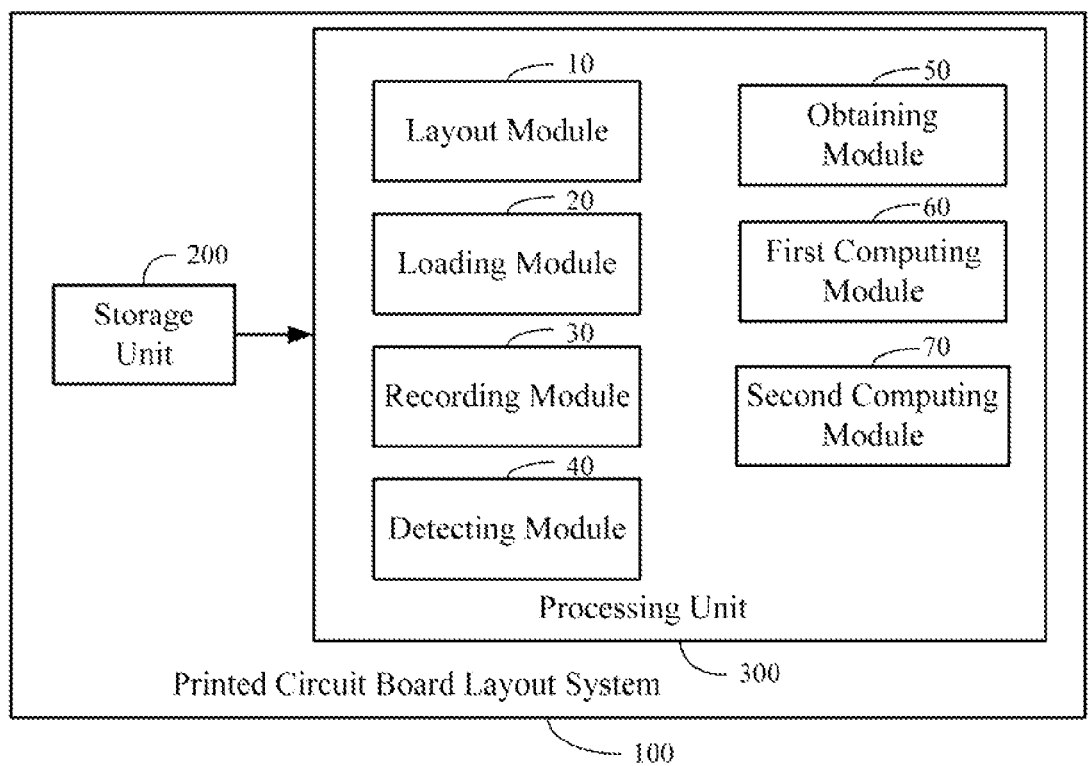
FIG. 1 is a block diagram of a PCB layout system, in accordance with an exemplary embodiment.

Referring to FIG. 1, a PCB layout system 100 includes a storage unit 200 and a processing unit 300.

The storage unit 200 stores a plurality of PCB layout files and height attribute files. Each PCB layout file is created based on a schematic circuit diagram, similar to the process of converting schematic circuit diagrams to PCB layouts by any conventional PCB layout software. Outline information is also created together with each PCB layout file, defining an outline of the layout diagram for each PCB layout file. The outline information can be recorded in the corresponding PCB layout file. The outline information may include a plurality of coordinates defining a plurality of points joined together to form the outline.

Each height attribute file is associated with one PCB layout file. Each height attribute file records boundary information and height information. The height information defines height values and positions where the height values are arranged. The boundary information defines a plurality of areas. When the area is associated with one height value, then components to be mounted within the area should not be taller than the associated height value.

The processing unit 300 includes a layout module 10, a loading module 20, a recording module 30, and a detecting module 40.

Figure 2:
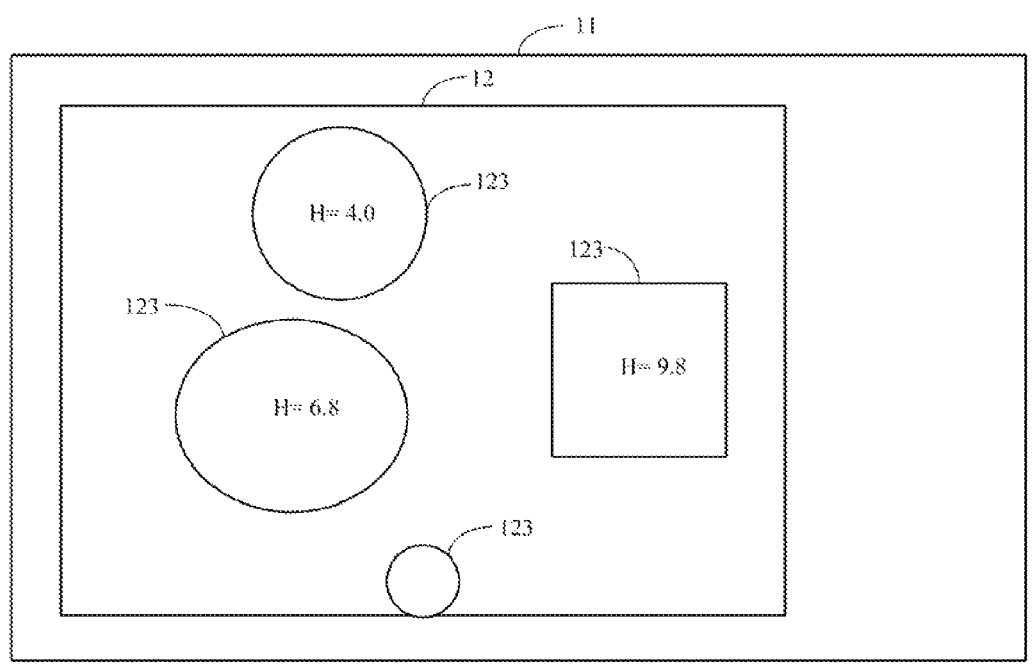
FIG. 2 is a schematic diagram showing an outline and a plurality of boundaries displayed in a user interface of the PCB layout system of FIG. 1.

The layout module 10 is configured to generate PCB layout files according to schematic circuit diagrams and display the files on a user interface 11, such as a computer monitor, for displaying an outline 12 of a PCB layout diagram (see FIG. 2).

The loading module 20 is configured to load the height attribute file to obtain the boundary information and height information to display corresponding areas and height values on the corresponding PCB layout diagram. For example, as shown in FIG. 2, after the loading module 20 loads the height attribute file, the height values and a plurality of boundaries 123 are displayed within the outline 12.

Figure 3:
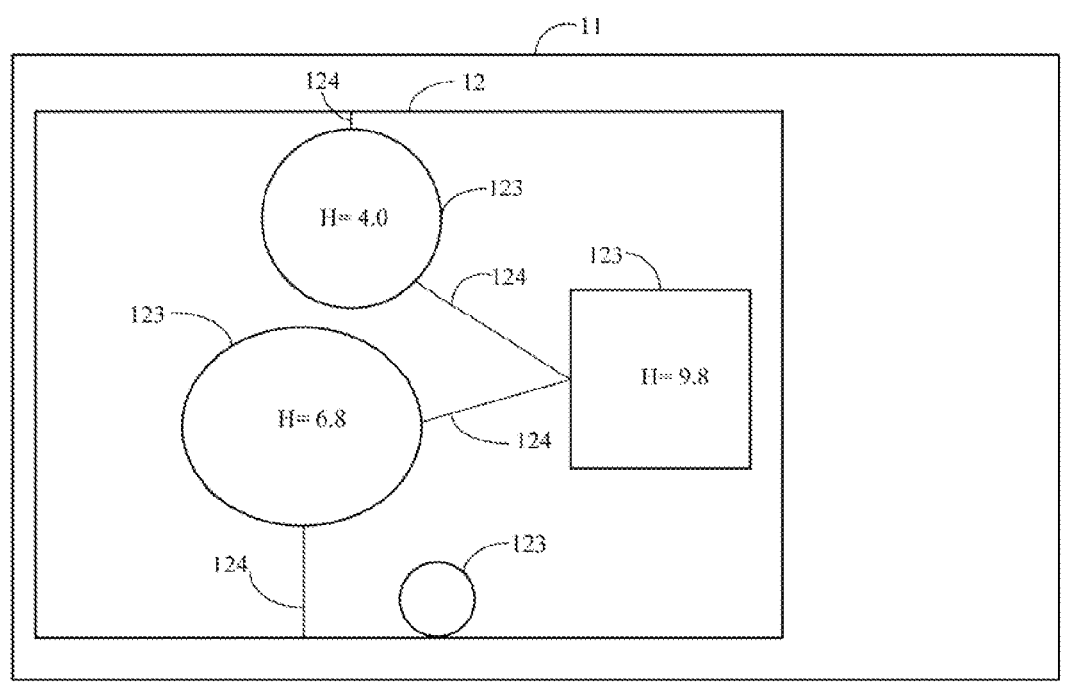
FIG. 3 is a schematic diagram showing auxiliary lines added to connect the outline and the boundaries.

The recording module 30 is configured to draw a plurality of auxiliary lines according to the designer's operation and record auxiliary line information of auxiliary lines. The auxiliary line information is stored in the storage unit 200. As shown in FIG. 3, the auxiliary lines 124 are straight lines for connecting the outline 12 and the boundary 123 or connecting the two boundaries 123.

The detecting module 40 is configured to detect whether a command for recording position information of the points within each of the boundaries 123 is input. In the embodiment, the position information of the points within each boundary 123 includes a plurality of coordinates defining a height restriction area.

The processing unit 300 further includes an obtaining module 50, a first computing module 60, and a second computing module 70.

The obtaining module 50 is configured to obtain the outline information of one PCB layout file, the boundary information of the height attribute file corresponding to the PCB layout file, and the auxiliary line information recorded by the recording module 30, after an input is detected by the detecting module 40.

The first computing module 60 is configured to perform a logical operation according to the outline information, the boundary information and the auxiliary line information obtained by the obtaining module 50 to obtain the position information of the points within each of the boundaries 123. To be specific, the first computing module 60 performs a logical NAND according to the outline information, the boundary information and the auxiliary line information, and the logical NAND is similar to the process of logical NAND in computer science.

The second computing module 70 is configured to determine whether one height limit is associated with one boundary 123. In detail, the second computing module 70 performs intersection operation according to the position information of the points within one boundary 123 and the positions of all the height information of the height attribute file corresponding to the PCB layout file to determine whether one height limit is associated with the boundary 123. If the intersection is null, the second computing module 70 determines the height limit in the boundary 123 is 0 and will not be displayed in the boundary 123, and further indicates that no component should be placed in that area.

Figure 4:
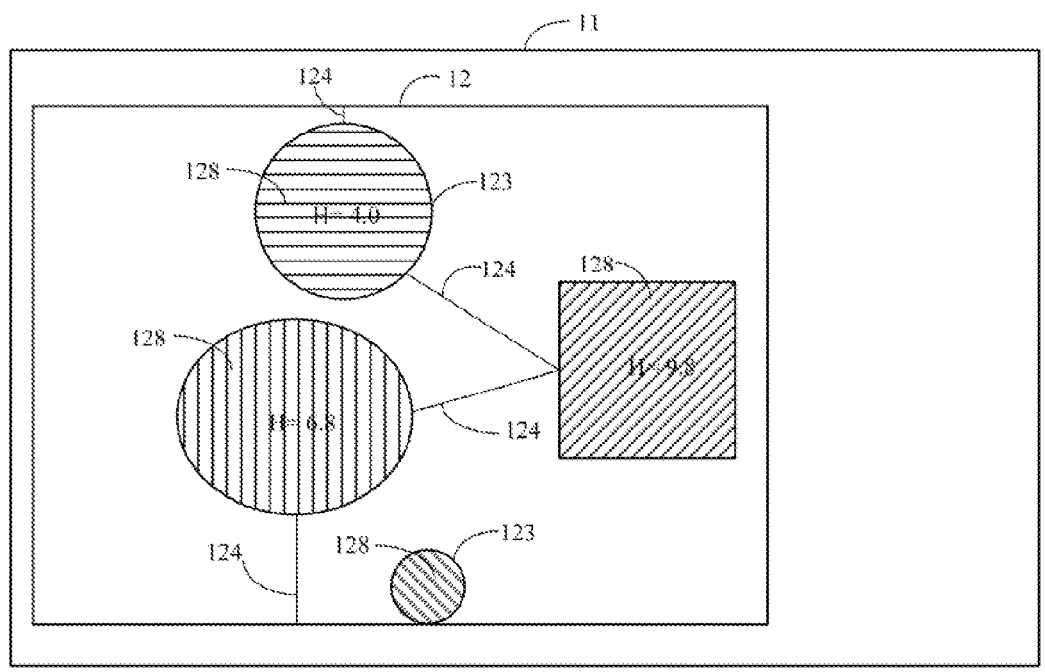
FIG. 4 is a schematic diagram showing a plurality of height restriction areas.

If one height limit is associated with one boundary 123, the layout module 10 sets the associated height values as the height limit of the points within the boundary 123 and adds sectional lines in the boundary 123, thus a height restriction area 128 (see FIG. 4) with the height limit is formed. Therefore, if a component, the height of which is greater than the height of the height restriction area 128, is placed in the height restriction area 128, the layout module 10 outputs a warning that the component will not fit and that another component should be selected. If no height is associated with one boundary 123, the layout module 10 sets a default height value, for example 0 mil, as the height limit of the height restriction area 128 corresponding to the boundary 123 and adds sectional lines in the boundary 123, thus a height restriction area 128 with the default height value is formed. It should be noted that in the embodiment only the displayed heights greater than 0 are displayed.

Figure 5:
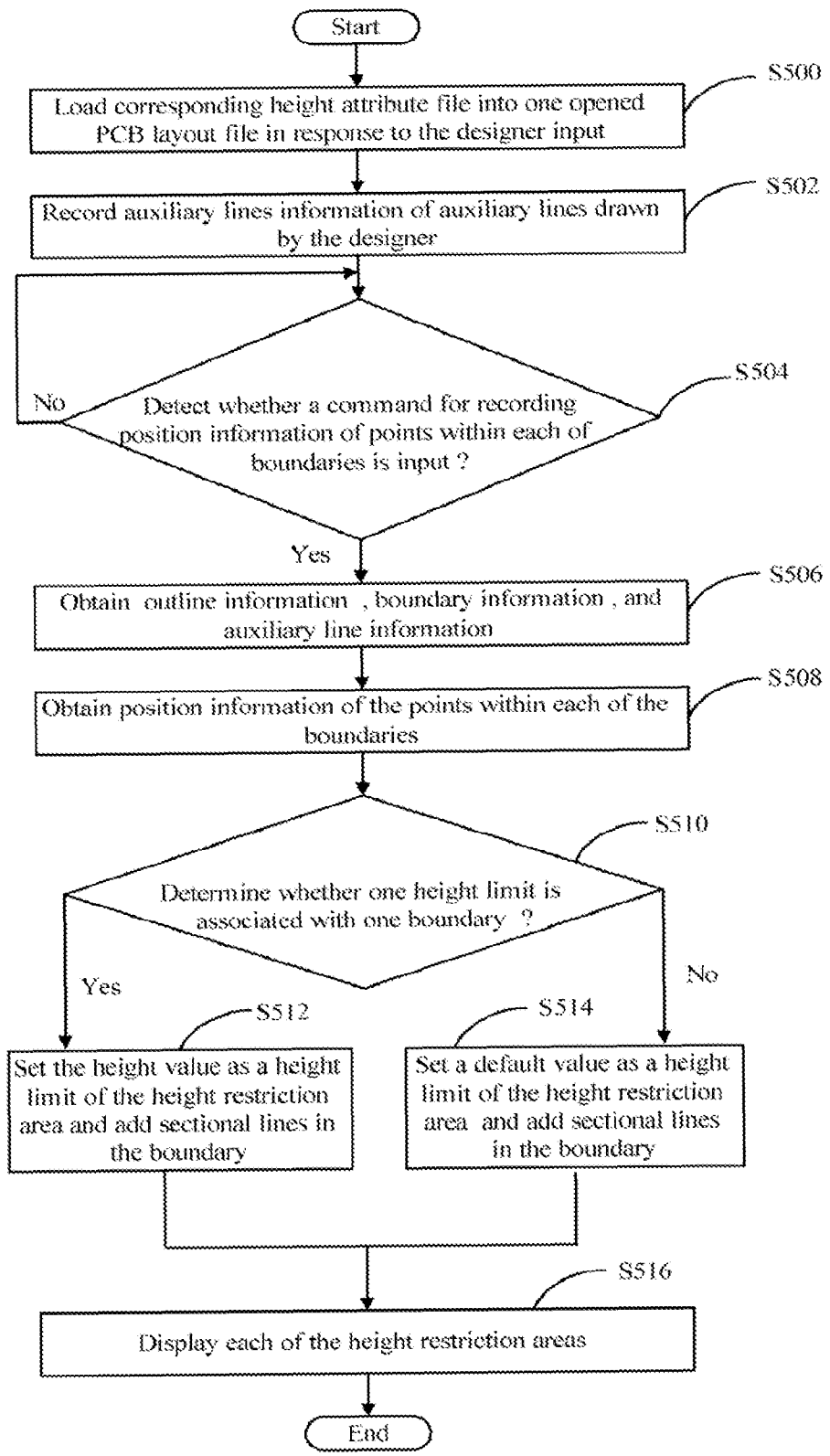
FIG. 5 is a flowchart of a method for generating height restriction areas, in accordance with an exemplary embodiment.

Referring to FIG. 5, a flowchart of a method for generating height restriction areas 128 is illustrated.

In step S500, the loading module 20 loads the corresponding height attribute file into one opened PCB layout file in response to the designer input.

In step S502, the recording module 30 draws a plurality of auxiliary lines according to the designer's operation and records auxiliary line information of auxiliary lines 124. In the embodiment, the auxiliary lines 124 is a straight line for connecting the outline 12 and the boundary 123 or connecting the two boundaries 123.

In step S504, the detecting module 40 detects whether a command for recording position information of the points within each of the boundaries 123 is input. The process goes to step S505 when yes, and the process repeats the step S504 when no.

In step S506, the obtaining module 50 obtains the outline information of the opened PCB layout file, the boundary information of the height attribute file corresponding to the opened PCB layout file, and the auxiliary line information recorded by the recording module 30.

In step S508, the first computing module 60 performs a logical operation according to the outline information, the boundary information and the auxiliary line information obtained by the obtaining module 50 to obtain the position information of the points within each of the boundaries 123 as height restriction areas.

In step S510, the second computing module 70 performs intersection operation according to the position information of the points within one boundary 123 and the position information of all the height information of the height attribute file corresponding to the opened PCB layout file to determine whether one height limit is associated with one boundary 123. If the intersection is null, the second computing module 70 determines the height limit in the boundary 123 is 0 and will not be displayed in the boundary 123; otherwise, the height limit is associated with one boundary 123.

In step S512, if one height limit is associated with one boundary 123, the layout module 10 sets the height value as the height limit of the height restriction area 128 corresponding to the boundary 123 and adds sectional lines in the boundary 123, thus a height restriction area 128 with the height limit is formed.

In step S514, If no height is associated with one boundary, the layout module 10 sets a default value, for example 0 mil, as the height limit of the height restriction area 128 corresponding to the boundary 123 and adds sectional lines in the boundary 123, thus a height restriction area 128 with the default height value is formed.

In step S516, the layout module 10 displays each of the height restriction areas 128.

By the application of the PCB layout system 100, when the PCB layout system 100 detects that a command for recording position information of the points within each of the boundaries 123 is input, the PCB layout system 100 automatically obtains the outline information of one opened PCB layout file, the boundary information of the height attribute file corresponding to the opened PCB layout file, and the recorded auxiliary line information. The PCB layout system 100 forms several height restriction areas 128 according to the outline information, the boundary information, and the auxiliary line information, and sets height limits of the height restriction areas 128. Thereby, the designer does not need to draw different height restriction areas for each new PCB that conserves time.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A printed circuit board (PCB) layout system, comprising:
    a storage unit configured to store a plurality of PCB layout files and a plurality of height attribute files, wherein each of the PCB layout files is created based on a schematic circuit diagram, outline information is also created together with each PCB layout file, defining an outline of the layout diagram for each PCB layout file, each height attribute file is associated with one PCB layout file, each height attribute file records boundary information and height information, the height information defines height values and positions where the height values are arranged; and
    a processing unit comprising:
    a layout module configured to generate PCB layout files according to schematic circuit diagrams and display an outline of a PCB layout diagram on a user interface;
    a recording module configured to draw an auxiliary line for connecting the outline and a boundary of the PCB, or two boundaries of the PCB and record the auxiliary line information in the storage;
    an obtaining module configured to obtain the outline information of one PCB layout file, the boundary information of the height attribute file corresponding to the PCB layout file, and the auxiliary line information, when a command for recording position information of points within each of the boundaries is input;
    a first computing module configured to perform a logical operation according to the outline information, the boundary information and the auxiliary line information obtained by the obtaining module to obtain position information of the points within each of the boundaries as a height restriction area; and
    a second computing module configured to determine whether one of the height values is associated with the boundary;
    wherein the layout module sets the associated height values as the height limit of the height restriction area corresponding to the boundary on the determination of one of the height values is associated with the boundary and adds sectional lines in the boundary.

2. The printed circuit board layout system of claim 1, wherein the printed circuit board layout system further comprises a loading module, the loading module is configured to load the height attribute file to obtain the boundary information and height information to display corresponding areas and height values on the corresponding PCB layout diagram.

3. The printed circuit board layout system of claim 1, wherein the auxiliary line is a straight line for connecting the outline and the boundary contained in the range of the outline or connecting two boundaries.

4. The printed circuit board layout system of claim 1, wherein the second computing module performs intersection operation with the position information of the points within one boundary and the positions of all the height information of the height attribute file corresponding to the PCB layout file to determine whether one height limit is associated with the boundary.

5. The printed circuit board layout system of claim 1, wherein the first computing module performs a logical NAND with the outline information, the boundary information and the auxiliary line information.

6. The printed circuit board layout system of claim 1, wherein when the second computing module determines that no height value is associated with the boundary, the layout module further set a default height value as the height limit of the height restriction area corresponding to the boundary and adds sectional lines in the height restriction area.

7. A method for generating height restriction areas, the method is applying for a printed circuit board (PCB) layout system, the printed circuit board layout system comprises a storage unit that configured to store a plurality of PCB layout files, height attribute files, and auxiliary line information, wherein each of the PCB layout files is created based on a schematic circuit diagram, outline information is also created together with each PCB layout file, defining an outline of the layout diagram for each PCB layout file, each height attribute file is associated with one PCB layout file, each height attribute file records boundary information and height information, the height information defines height values and positions where the height values are arranged, the method comprising:
   (a) drawing an auxiliary line for connecting the outline of the PCB and a boundary of the PCB, or two boundaries of the PCB together and recording the auxiliary line information in the storage by the computer;
   (b) obtaining the outline information, the boundary information, and the auxiliary line information, when a command for recording position information of points within each of the boundaries is input by the computer;
   (c) obtaining position information of the points within each of the boundaries;
   (d) determining whether one of the height values is associated with the boundary by the computer; and
   (e) setting the associated height values as the height limit of height restriction areas corresponding to the boundary on the determination of one of the height values is associated with the boundary and adds sectional lines in the boundary.

8. The method of claim 7, the step (c) further comprising:
performing a logical NAND with the outline information, the boundary information and the auxiliary line information to obtain the position information of the points within each of the boundaries.

9. The method of claim 7, the step (e) further comprising:
performing intersection operation with the position information of the points within one boundary and the positions of all the height information of the height attribute file corresponding to the PCB layout file;
determining no height value is associated with the boundary, when the intersection is null;
determining one of the height values is associated with the boundary, when the intersection is not null.

10. The method of claim 7, the step (e) further comprising:
setting the associated height values as the height limit of the height restriction area corresponding to the boundary, when one of the height values is associated with the boundary;
setting a default height value as the height limit of the height restriction area corresponding to the boundary, when no height values is associated with the boundary.

11. The method of claim 7, wherein the auxiliary is a straight line for connecting the outline and the boundary contained in the range of the outline or connecting the two boundaries.

* * * * *

UNITED STATES PATENT AND TRADEMARK OFFICE
CERTIFICATE OF CORRECTION

PATENT NO. : 8,255,863 B2  
APPLICATION NO. : 12/790871  
DATED : August 28, 2012  
INVENTOR(S) : Xiao-Cheng Sheng It is certified that error appears in the above-identified patent and that said Letters Patent is hereby corrected as shown below:

On the title page, please insert Item (30) regarding "Foreign Application Priority Data" with the following:

-- (30)     Foreign Application Priority Data

Nov. 16, 2009   (CN) ..................................200910309774.1 --

Signed and Sealed this
Twenty-ninth Day of October, 2013

Teresa Stanek Rea
*Deputy Director of the United States Patent and Trademark Office*